US011862563B2

(12) United States Patent
Jezewski et al.

(10) Patent No.: US 11,862,563 B2
(45) Date of Patent: Jan. 2, 2024

(54) COBALT BASED INTERCONNECTS AND METHODS OF FABRICATION THEREOF

(71) Applicant: Tahoe Research, Ltd., Dublin (IE)

(72) Inventors: Christopher J. Jezewski, Portland, OR (US); Tejaswi K. Indukuri, Boise, ID (US); Ramanan V. Chebiam, Hillsboro, OR (US); Colin T. Carver, Portland, OR (US)

(73) Assignee: Tahoe Research, Ltd., Dublin (IE)

( * ) Notice: Subject to any disclaimer, the term of this patent is extended or adjusted under 35 U.S.C. 154(b) by 0 days.

(21) Appl. No.: 17/718,038

(22) Filed: Apr. 11, 2022

(65) Prior Publication Data

US 2022/0238451 A1 Jul. 28, 2022

Related U.S. Application Data

(60) Division of application No. 16/881,530, filed on May 22, 2020, now Pat. No. 11,328,993, which is a
(Continued)

(51) Int. Cl.
*H01L 23/532* (2006.01)
*H01L 21/768* (2006.01)
(Continued)

(52) U.S. Cl.
CPC .. *H01L 23/53209* (2013.01); *H01L 21/76831* (2013.01); *H01L 21/76843* (2013.01);
(Continued)

(58) Field of Classification Search
CPC ......... H01L 23/53209; H01L 21/76831; H01L 21/76843; H01L 21/76846;
(Continued)

(56) References Cited

U.S. PATENT DOCUMENTS 7,586,196 B2   9/2009  Dubin et al.
7,850,770 B2 * 12/2010 Wirth ................ H01L 21/76843
                                                 106/1.27

(Continued)

FOREIGN PATENT DOCUMENTS

CN    1971901      5/2007
CN    104051336    9/2014
(Continued)

OTHER PUBLICATIONS

European Patent Office, Extended European Search Report dated Jul. 31, 2017, in European Application No. 15729733.
(Continued)

*Primary Examiner* — Patricia D Valenzuela
(74) *Attorney, Agent, or Firm* — Studebaker & Brackett PC

(57) ABSTRACT

An embodiment includes a metal interconnect structure, comprising: a dielectric layer disposed on a substrate; an opening in the dielectric layer, wherein the opening has sidewalls and exposes a conductive region of at least one of the substrate and an interconnect line; an adhesive layer, comprising manganese, disposed over the conductive region and on the sidewalls; and a fill material, comprising cobalt, within the opening and on a surface of the adhesion layer. Other embodiments are described herein.

22 Claims, 10 Drawing Sheets

Related U.S. Application Data continuation of application No. 15/925,009, filed on Mar. 19, 2018, now Pat. No. 10,700,007, which is a continuation of application No. 14/137,526, filed on Dec. 20, 2013, now Pat. No. 9,997,457.

(51) Int. Cl.
| | |
|---|---|
| *H01L 29/49* | (2006.01) |
| *H01L 29/78* | (2006.01) |
| *H01L 23/522* | (2006.01) |
| *H01L 23/00* | (2006.01) |

(52) U.S. Cl.
CPC .. *H01L 21/76846* (2013.01); *H01L 21/76847* (2013.01); *H01L 21/76879* (2013.01); *H01L 21/76882* (2013.01); *H01L 21/76883* (2013.01); *H01L 23/5226* (2013.01); *H01L 23/53261* (2013.01); *H01L 23/53266* (2013.01); *H01L 23/53295* (2013.01); *H01L 29/4966* (2013.01); *H01L 29/7848* (2013.01); *H01L 21/76849* (2013.01); *H01L 21/76873* (2013.01); *H01L 21/76877* (2013.01); *H01L 23/53233* (2013.01); *H01L 23/53238* (2013.01); *H01L 24/11* (2013.01); *H01L 2924/0002* (2013.01)

(58) Field of Classification Search
CPC ......... H01L 21/76847; H01L 21/76879; H01L 21/76882; H01L 21/76883; H01L 23/5226; H01L 23/53261; H01L 23/53266; H01L 23/53295; H01L 29/4966; H01L 29/7848; H01L 21/76849; H01L 21/76877; H01L 23/53233; H01L 23/53238; H01L 2924/0002; H01L 21/76873; H01L 24/11

See application file for complete search history.

(56) References Cited

U.S. PATENT DOCUMENTS

| | | | |
|---|---|---|---|
| 7,867,891 B2 | 1/2011 | O'Brien | |
| 8,508,018 B2 | 8/2013 | Akolkar | |
| 9,997,457 B2 | 6/2018 | Jezewski | |
| 2002/0019127 A1 | 2/2002 | Givens | |
| 2005/0095852 A1 | 5/2005 | Saenger | |
| 2007/0020829 A1* | 1/2007 | Hotta | H01L 23/53209 257/E23.15 |
| 2007/0120242 A1 | 5/2007 | Oh et al. | |
| 2008/0119047 A1 | 5/2008 | Yu | |
| 2008/0254232 A1 | 10/2008 | Gordon et al. | |
| 2009/0206484 A1 | 8/2009 | Baker-O'Neal | |
| 2010/0164119 A1 | 7/2010 | Takesako | |
| 2011/0027985 A1 | 2/2011 | Tsumura et al. | |
| 2011/0057317 A1 | 3/2011 | Koike et al. | |
| 2011/0062587 A1 | 3/2011 | Yang | |
| 2011/0101529 A1 | 5/2011 | Kao et al. | |
| 2011/0223772 A1 | 9/2011 | Mayer | |
| 2011/0266676 A1 | 11/2011 | Isobayashi | |
| 2012/0077053 A1 | 3/2012 | Akolkar | |
| 2012/0141667 A1 | 6/2012 | Kim et al. | |
| 2012/0319279 A1 | 12/2012 | Isobayashi | |
| 2013/0026637 A1 | 1/2013 | Hou | |
| 2013/0178058 A1 | 7/2013 | Edelstein et al. | |
| 2013/0260555 A1 | 10/2013 | Zope | |
| 2014/0035143 A1 | 2/2014 | Lee | |
| 2014/0183738 A1 | 7/2014 | Jezewski et al. | |
| 2014/0183743 A1 | 7/2014 | Matsumoto | |
| 2014/0287577 A1* | 9/2014 | Emesh | H01L 21/76873 438/618 |
| 2015/0108646 A1 | 4/2015 | Chae | |

FOREIGN PATENT DOCUMENTS

| | | |
|---|---|---|
| JP | 2007-142236 | 6/2007 |
| JP | 2007-221103 | 8/2007 |
| JP | 2008060415 | 3/2008 |
| JP | 2009-147137 | 7/2009 |
| JP | 2009-164354 | 7/2009 |
| JP | 2010147312 | 7/2010 |
| KR | 10-2007-0053636 | 5/2007 |
| WO | WO-2013132749 | 9/2013 |

OTHER PUBLICATIONS

International Search Report and Written Opinion for International Patent Application No. PCT/IB2015/000198, dated May 29, 2015.
International Preliminary Report and Patentability for International Patent Application No. PCT/IB2015/000198), dated Jun. 21, 2016.
Taiwan Intellectual Property Office, Office Action dated Dec. 29, 2015 in Taiwan Patent Application No. 103139777. (Redacted).
Taiwan Intellectual Property Office, Decision of Rejection dated Sep. 7, 2016, in Taiwanese Patent Application No. 103139777.
Office Action from U.S. Appl. No. 14/137,526, dated Jun. 9, 2015, 14 pages.
Office Action from U.S. Appl. No. 14/137,526, dated Jan. 14, 2016, 14 pages.
Office Action from U.S. Appl. No. 14/137,526, dated Sep. 20, 2016, 13 pages.
Office Action from U.S. Appl. No. 14/137,526, dated Mar. 13, 2017, 19 pages.
Office Action from U.S. Appl. No. 14/137,526, dated Oct. 20, 2017, 15 pages.
Office Action from Japanese Patent Application No. 2016-526908, dated Oct. 9, 2018, 14 pages.
Office Action from Japanese Patent Application No. 2016-526908, dated Jul. 9, 2019. 34 pgs.
Notice of Allowance from Japanese Patent Application No. 2016-526908, dated Dec. 24, 2019, 2 pgs.
Notice of Allowance from Taiwan Office Patent Application No. 103139777, dated Oct. 19, 2017, 2 pgs.
Office Action from Chinese Patent Application No. 201580002697.9, dated Jul. 28, 2020, 13 pgs.
Office Action from Korean Patent Application No. 10-2016-7013373, dated Jan. 30, 2021, 11 pages.
Office Action from Chinese Patent Application No. 201580002697.9, dated Mar. 15, 2021, 10 pages.
Notice of Allowance from European Patent Application No. 15729733.4, dated Apr. 1, 2021, 2 pgs.
Final Office Action from Korean Patent Application No. 10-2016-7013373, dated Aug. 24, 2021, 5 pages.
Final Office Action from Korean Patent Application No. 10-2016-7013373, dated Nov. 3, 2021, 5 pages.
Search Report from European Patent Application No. 21170662.7, dated Dec. 21, 2021, 13 pages.
Notice of Allowance from Chinese Patent Application No. 201580002697.9, dated Nov. 1, 2021, 10 pgs.
Office Action from Korean Patent Application No. 10-2021-7040015, dated Mar. 28, 2022, 6 pages.

* cited by examiner

COBALT BASED INTERCONNECTS AND METHODS OF FABRICATION THEREOF

CROSS-REFERENCE TO RELATED APPLICATION

This patent application is a Divisional of U.S. patent application Ser. No. 16/881,530, filed May 22, 2020, which is a Continuation of U.S. patent application Ser. No. 15/925,009, filed Mar. 19, 2018, now U.S. Pat. No. 10,700,007, issued Jun. 30, 2020, which is a Continuation of U.S. patent application Ser. No. 14/137,526 filed Dec. 20, 2013, now U.S. Pat. No. 9,997,457 issued Jun. 12, 2018, entitled "COBALT BASED INTERCONNECTS AND METHODS OF FABRICATION THEREOF", the entire disclosure of which are hereby incorporated by reference in their entirety and for all purposes.

TECHNICAL FIELD

Embodiments of the present invention relate generally to metal interconnect structures and their methods of fabrication. More particularly, embodiments of the present invention relate to cobalt based interconnect structures and their methods of fabrication.

BACKGROUND

Integrated circuit (IC) devices typically include circuit elements such as transistors, capacitors and resistors formed within or on a semiconductor substrate. Interconnect structures are used to electrically couple or connect the discrete circuit elements into functional circuits. Typical metal interconnects may include a line portion and a via portion.

Interconnect structures may be fabricated from copper, and may include a barrier layer such as titanium or tantalum or nitride materials such as tantalum nitride or titanium nitride, or a combination thereof (e.g., tantalum nitride/ tantalum (TNT)). A problem with utilizing copper interconnect structures is that they are highly susceptible to electromigration which can lead to void formation and failure.

Tungsten metallization has been successfully used to fabricate front end contacts and, thus, has been suggested for back end metallization for interconnect fabrication. A desirable advantage with utilizing tungsten metallization is that it is highly resistant to detrimental electromigration effects. However, a disadvantage with utilizing tungsten metallization is that its electrical resistivity is higher than copper. More specifically, tungsten line resistances are 4 to 6 times higher than copper interconnects, and via resistances can be as much as 20% higher. These high resistances severely degrade IC performance and are therefore undesirable.

DETAILED DESCRIPTION

Figure 1A:
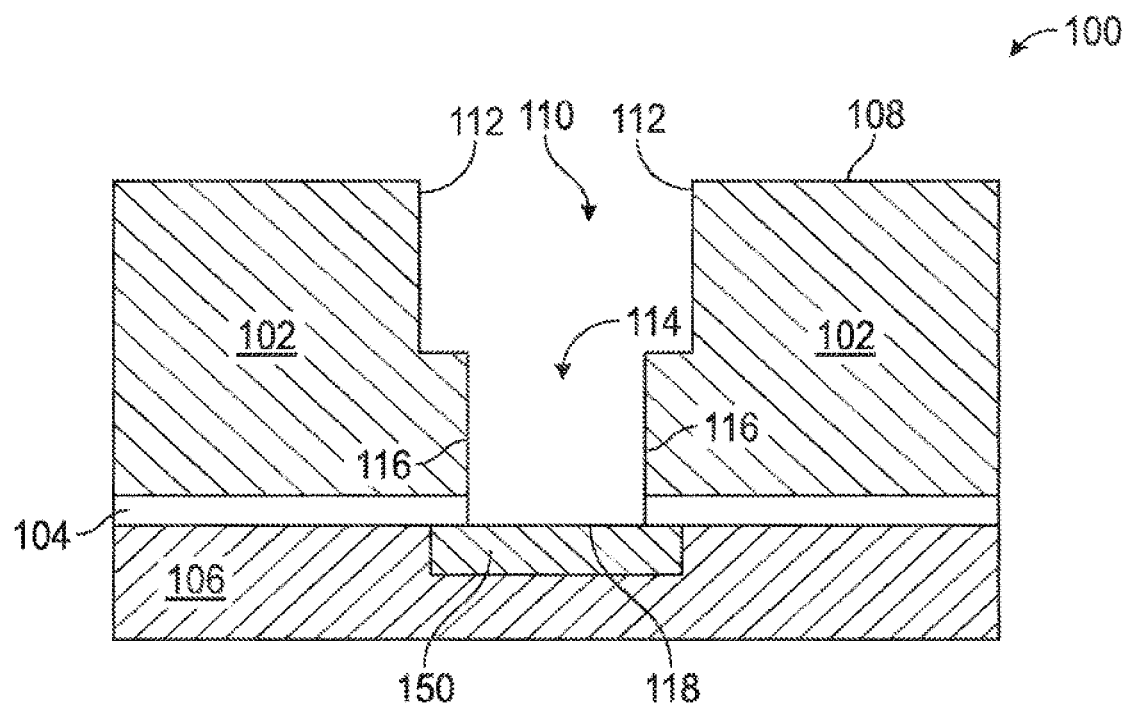
FIGS. 1A-1E are cross-sectional side view illustrations of a method of forming cobalt interconnects according to an embodiment of the present invention.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

One embodiment of the invention is a cobalt interconnect which includes a manganese (Mn) based adhesion layer and a cobalt fill material. The adhesion layer (sometimes also referred to herein as a barrier layer or wetting layer) may include various Mn based compositions such as, for example, Mn, manganese nitride (MnN), or manganese silicon nitride (MnSi$_x$N$_y$). The Mn based adhesion layer may comprise a film deposited in patterned backend interconnect structures. These interconnect structures may be metalized with cobalt. The Mn based layer adheres well to the interlayer dielectric (ILD) that helps form the interconnect in some embodiments. The Mn based layer also provides wetting to the cobalt metal. Thus, the Mn based adhesion layer helps achieve robust gap filling of interconnect structures at small scales such as 22 nm, 14 nm, 10 nm and beyond.

An embodiment includes a cobalt interconnect that includes a cobalt plug layer and a cobalt fill material. The plug layer is formed from a different composition and/or by a different process than that used to for the cobalt fill material. Such cobalt interconnects are advantageous since they have a low resistance (e.g., lower than tungsten) and are highly resistive to electromigration (e.g., more resistive to electromigration than copper), enabling fabrication of high performance interconnect structures. As dimensions scale in conventional interconnect processing, the high resistance of traditional barrier layers (e.g., TNT barrier layers) can impact the performance of conventional copper interconnects to greater extents. However, lower resistance Mn layers may mitigate these resistance issues.

In a first aspect, a conformal Mn based adhesion layer is formed in an opening in a dielectric layer. A cobalt-based fill material is then deposited or grown on the Mn based adhesion layer to form a cobalt interconnect.

FIGS. 1A-1E illustrate a method of forming a cobalt interconnect with a Mn based adhesion layer and a cobalt-containing fill layer according to embodiments of the present invention. FIG. 1A illustrates a substrate 106 with top surface 118 that may be used as a substrate on which a cobalt interconnect can be formed. Substrate 106 can include any portion of a partially fabricated IC on which a cobalt interconnect is ultimately fabricated. For example, substrate 106 will typically include, or have formed thereon, active and passive devices. As depicted in FIG. 1A, a conductive region 150 is included in substrate 106, on to which a cobalt interconnect is ultimately formed. In one such embodiment, the substrate 106 has been processed through front end of line (FEOL), and the conductive region 150 is a diffusion region formed in a crystalline semiconductor substrate or layer (e.g., the conductive region is a source or drain region of a transistor). In another such embodiment, the conductive region 150 is an underlying metal line in a back end of line (BEOL) metallization structure, as is described in greater detail below in association with FIG. 2. Thus, while portion 150 is at times referred to herein as a "conductive region 150" this may or may not indicate that area 150 is any more or less conductive than the rest of 106. Also, the use of 150 is not intended to indicate that 150 is necessarily nonmonolithic with 106 or was formed with a different process or non-simultaneously with 106. For example, when 106 is an interconnect line area 150 is monolithic with 106 and structurally and functionally indistinguishable from the rest of 106. However, area 150 may also be an area doped differently than the rest of 106 when 150 is to serve as a source or drain. The above clarification is provided to avoid excessive figures and to otherwise provide clarity in succinct manner.

Although embodiments may be ideally suited for fabricating semiconductor ICs such as, but not limited to, microprocessors, memories, charge-coupled devices (CCDs), system on chip (SoC) ICs, or baseband processors, other applications can also include microelectronic machines, MEMS, lasers, optical devices, packaging layers, and the like. Embodiments may also be used to fabricate individual semiconductor devices (e.g., a cobalt structure described herein may be used to fabricate a gate electrode of a metal oxide semiconductor (MOS) transistor).

Referring again to FIG. 1A, a dielectric layer 102 is formed above substrate 106. The dielectric layer 102 may be composed of any suitable dielectric or insulating material such as, but not limited to, silicon dioxide, SiOF, carbon-doped oxide, a glass or polymer material, and the like. An opening is formed in the dielectric layer. The opening exposes the conductive region 150 to which contact (indirect or direct) by a cobalt interconnect is ultimately made. In one embodiment, as depicted in FIG. 1A, the opening includes a lower opening 114 (e.g., a via hole or slot) with sidewalls 116 and an upper opening 110 (e.g., a metal line trench) with sidewalls 112, as is common in a dual damascene process. Although two openings are depicted (or a single opening with varying widths), it is to be appreciated that a single opening may instead be formed in the dielectric layer 102 (e.g., as is used in a single damascene approach where only a line or a via, but not both, is fabricated in a single operation). The opening or openings may be fabricated in dielectric layer 102 by well known lithography and etch processing techniques typically used in damascene and dual damascene type fabrication. Although only a single dielectric layer 102 is depicted, multiple layers of the same or differing dielectric materials may instead be used (e.g., a first dielectric layer having opening 114 therein, and a second dielectric layer having opening 110 therein). Additionally, in an embodiment, and as depicted in FIG. 1A, the dielectric layer 102 is formed on an etch stop layer 104 disposed on substrate 106. The etch stop layer 104 may be composed of a material such as silicon nitride or silicon oxynitride.

Figure 1B:
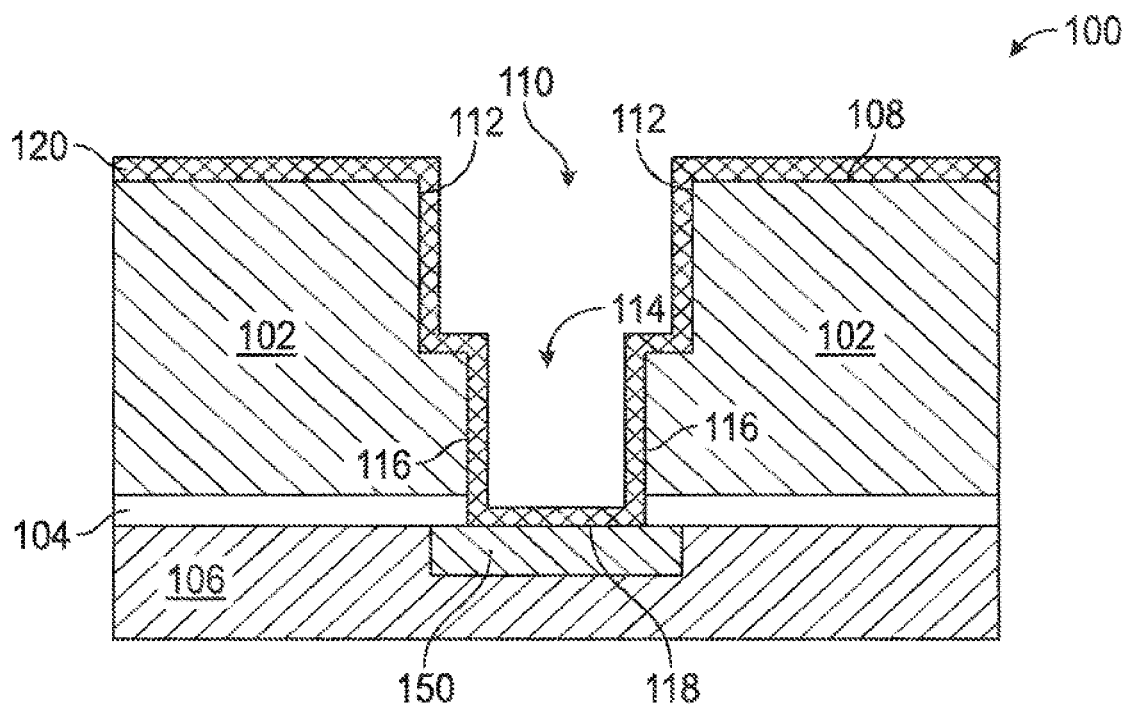

Referring to FIG. 1B, a Mn based adhesion layer 120 (e.g., an adhesion layer including Mn, MnN, $MnSi_xN_y$, and the like) is deposited. In other systems a seed layer may be formed on a TNT based adhesion layer. Seed layers, such as the seed layer disclosed in U.S. patent application Ser. No. 13/730,184, may facilitate formation of fill material. However, no such seed layer is needed in the embodiment of FIG. 1B. Nor is deposition of an alloy between an adhesion layer and a seed layer needed in the embodiment of FIG. 1B. Thus, as will be seen below, a Mn based adhesion layer may directly contact ILD 102 and directly contact cobalt fill (described below) without the need for a TNT based adhesion layer, any seed layer, or any alloy layer between a TNT based adhesion layer and a seed layer.

In FIG. 1B the Mn based adhesion layer 120 may be formed on a top surface 108 of the dielectric layer 102 as well as on the exposed top surface 118 of the substrate 106 (e.g., on conductive region 150). While 106 is referred to as "substrate" in another embodiment 106 could be a metal interconnect line, and the like. The Mn based adhesion layer 120 is also formed on the sidewalls 116 of the upper opening 114, and the sidewalls 112 of the lower opening 110.

Mn based adhesion layer 120 may be a conformal layer composed of a material including Mn, MnN, $MnSi_xN_y$, $MnSi_xO_y$ (e.g., $Mn_2[SiO_4]$, $MnSiO_3$), other Mn based silicates, and the like. In an embodiment with the adhesion layer including Mn, the Mn content may include 90-100% Mn, where contamination (i.e., the remaining 10%) may include C, H, O and combinations thereof. In an embodiment with the adhesion layer including $MnN_x$, the Mn may compose 0-50% Mn and the N may compose 0-50%. In an embodiment with the adhesion layer including $MnN_x$, the adhesion layer may include $Mn_4N$ or $Mn_3N_2$. In an embodiment with the adhesion layer including $MnN_xSi_y$ the Mn and N may include up to 50% with the Si constituting the remainder of the material. In an embodiment Mn, N, and Si may be included with one another in various adhesion multilayer combinations such as bilayers or trilayers (e.g., an adhesion layer includes one sublayer including MnN and another sublayer including Mn), (e.g., one adhesion layer including a sublayer having Mn and N and another sublayer including primarily Mn), (e.g., one adhesion layer including a sublayer including $MnN_xSi_y$ and another sublayer including primarily Mn), and the like. As used herein, % of composition refers to atomic %.

In one embodiment, the Mn based adhesion layer 120 is formed to a thickness less than 3 nm, and typically 1 nm to 3 nm. In an embodiment thickness ranges for layer 120 (whether layer 120 includes a single layer or multiple sublayers such as one sublayer including MnN and another immediately adjacent sublayer including Mn) may range from 0.1 A to 50 A. In an embodiment layer 120 is between 10 A-20 A including, for example, 10, 12, 14, 16, 18, or 20 A.

In an embodiment, conductive region 150 includes at least some germanium (e.g., an exposed doped silicon germanium or doped germanium region, or a metal germanide region). In an embodiment, conductive region 150 includes at least some silicon (e.g., an exposed doped silicon region, or a metal silicide region).

The layer 120 may be deposited or grown by chemical vapor deposition (CVD), atomic layer deposition (ALD), physical vapor deposition (PVD), electroplating, electroless plating or other suitable process that deposits conformal thin films. In an embodiment, the layer 120 is deposited to form a high quality conformal layer that sufficiently and evenly covers all exposed surfaces within the openings and top surfaces. The adhesion layer may be formed, in one embodiment, by depositing the Mn based material at a slow deposition rate to evenly and consistently deposit the conformal adhesion layer. By forming the layer 120 in a conformal manner, compatibility of a subsequently formed fill material (such as cobalt) with the underlying structure may be improved. Specifically, the layer 120 can assist a deposition process by providing appropriate surface energetics for deposition thereon.

Deposition recipes of thin films using processes such as CVD, ALD, and PVD may vary depending on the desired process time, thickness, and quality of conformity. For example, utilizing CVD to deposit the adhesion layer 120 may create a conformal thin film layer more quickly than it would take an ALD process to deposit the same layer; however, the quality of the thin film deposited by the CVD process may be lower than the quality of the thin film deposited by the ALD process. In another embodiment, the layer 120 is deposited by a PVD process. The PVD process may be performed with an increased distance between the receiving substrate and the corresponding sputter target to form a highly conformal thin film.

Figure 1C:
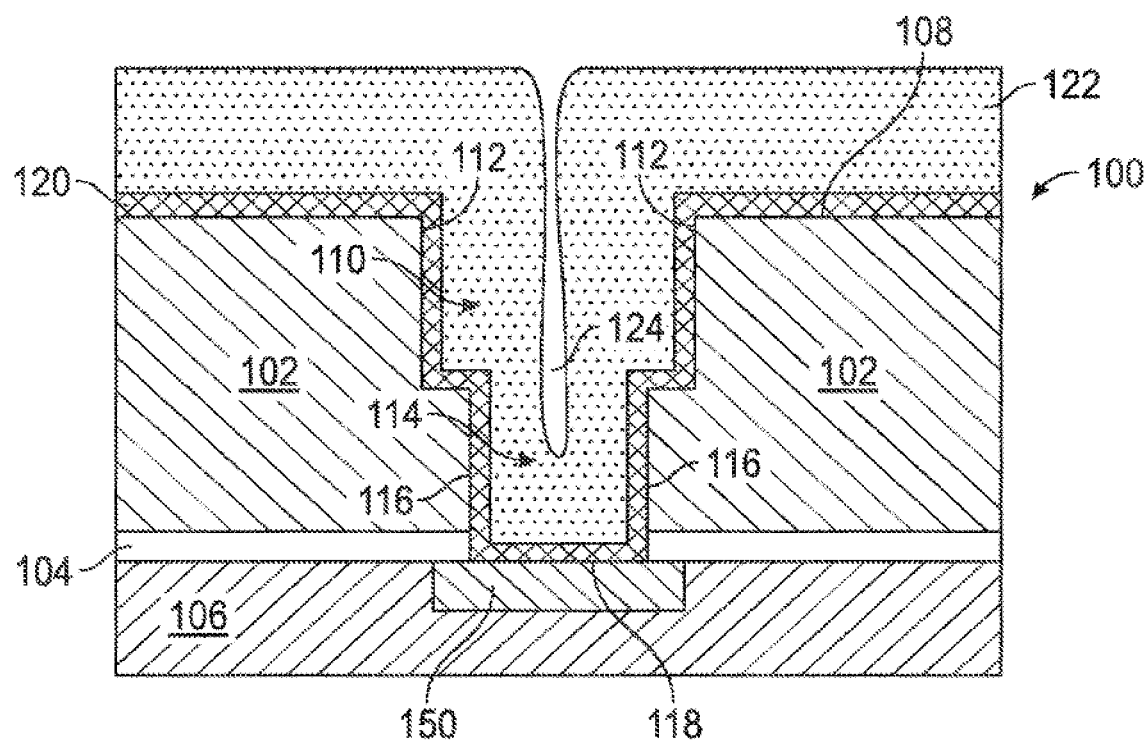

Referring to FIG. 1C, a fill material 122 may be formed on the exposed surfaces of the adhesion layer 120, such that the fill material 122 completely fills the openings 110 and 114 and is formed on the top surface of the adhesion layer 120 and on the top surface 108 of dielectric 102. A seam 124 may be formed within the openings 110, 114 during deposition of the fill material 122. In an embodiment, the fill material 122 is composed of a dilute alloy composed of approximately 0.25-5% of a non-cobalt element (e.g., Al, Ni, Cu, Ag, Au, Mn, Ti, V, Cr, Fe, Ta, W, Ru, P, B, C, N, Si, Ge, Mg, Zn, Rh, Pt, Cd, Hf, In, Sn, C, O, Be, Ca, Zr, Nb, Mo, Ir, Re, or Pd) with the remainder approximately 95+% cobalt. Such a dilute alloy can involve, either during deposition or processing subsequent to deposition, migration of the non-cobalt species to surfaces of fill 122. The migration can provide a diffusion barrier for the cobalt (in addition to adhesion/barrier layer 120) and/or be used to enhance adhesion of the cobalt to layer 120. Grain boundaries within the cobalt may also be filled by the non-cobalt species. In one embodiment, the fill material 122 consists essentially only of cobalt. In another embodiment, the fill material 122 is at least 90% cobalt. In yet another embodiment, the fill material 122 is composed of at least 50% cobalt.

In an embodiment of the invention, the cobalt fill material 122 may be formed by a process such as, but not limited to, CVD, ALD, PVD, electroplating, or electro-less plating. In one embodiment, the process method used to form the fill material 122 may be different than the process used to form the layer 120. Furthermore, the layer 120 may be formed conformally, while the fill material 122 is formed in a non-conformal or bottom up approach. For example, the layer 120 may be formed by an ALD deposition process that forms a conformal layer on exposed surfaces of the receiving substrate, while the fill material 122 may be formed by PVD process that directionally sputters the fill material onto the surfaces of the layer 120, with greater deposition rates on flat horizontal surfaces as opposed to on more vertically oriented sidewall surfaces. In another example, the layer 120 may be formed by an ALD deposition process that forms a conformal layer on exposed surfaces of the receiving substrate, while the fill material 122 may be formed by an electroplating process that grows the fill material from the surfaces of the layer 120. In yet another example, the layer 120 may be formed by a CVD deposition process and the fill material may be formed by a PVD process.

In another embodiment, the layer 120 and the fill material 122 may be deposited by the same process (e.g. ALD, CVD, or PVD) but with different sets of deposition parameters, such as pressure, deposition rate, temperature, and the like. For example, the layer 120 and the fill material 122 may be deposited by a CVD process; however, the set of parameters used in the CVD processing for the adhesion layer 120, such as deposition pressure and temperature, may be different than the set of parameters used in the CVD processing for the fill material 122. In another example, the layer 120 and the fill material 122 are formed by a PVD process, but the layer 120 may be formed by a PVD process with a larger distance between the target and the receiving substrate than the PVD process used to form the fill material 122. In another embodiment, the metal fill material 122 is formed by a columnated PVD process, while the layer 120 is formed by a non-columnated PVD process. Or alternatively, the layer 120 is formed by an ALD process with a lower deposition rate than the deposition rate of the ALD process used to form the fill material 122 such that the layer 120 is formed more conformally than the fill material 122.

Figure 1D:
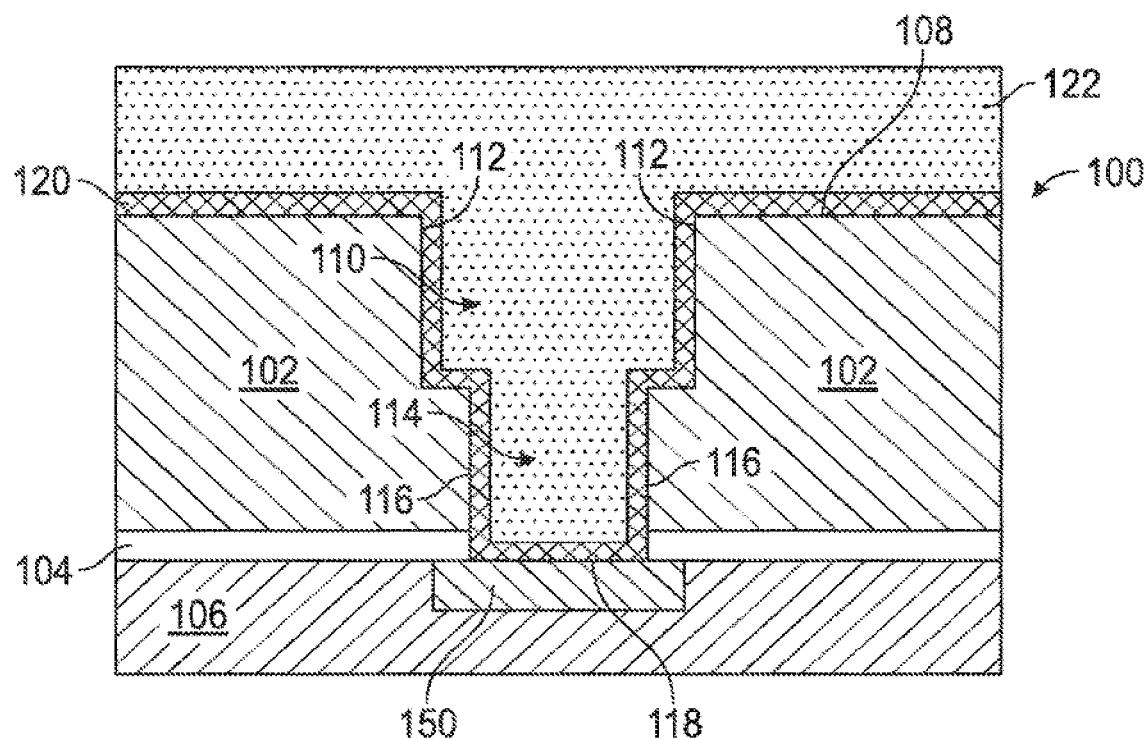

Referring to FIG. 1D, an anneal process may optionally be performed to reflow the deposited interconnect layer. The seam 124 from FIG. 1C may be removed subsequent to the anneal process, forming a solid structure within openings 110 and 114 within dielectric layer 102. The anneal process may help grow larger grain structures within the fill material 122, decreasing resistivity and expelling impurities from poor grain structures. In one embodiment, the anneal process uses gasses such as nitrogen, hydrogen, and argon. Furthermore, the anneal process may be performed at a temperature less than the thermal budget of the backend structures. For example, in one embodiment, the anneal process is performed at a temperature of room temperature to 300° C., 400° C., 500° C. or more. In another embodiment, the anneal process is performed at a temperature that is higher than the melting point of fill material 122 but lower than the thermal budget of the backend structures. In various embodiments the anneal process can vary widely (e.g., room temperature to 300° C., 400° C., 500° C. or more for interconnects ranging up to 900° C. for Front end applications). In such embodiments the anneal temperature is not higher than the melting point of the material being annealed as reflow of materials to be annealed can happen at much lower temperatures than the melting point for the material to be annealed. In such embodiments anneal temperatures for the material to be annealed may be less than the thermal budget of backend structures.

In yet another embodiment, a cycling technique may optionally be utilized to deposit the interconnect layer 122 (also referred to as fill layer 122) within the openings 114 and 110 without the seam 124. One cycle may involve one deposition of the fill material 122 and one anneal process. The anneal operation of one cycle may be set at a temperature and time duration to briefly reflow the fill material to improve step coverage. The deposition operation of one cycle may be a short deposition to deposit less fill material, such that several operations are required to completely fill the via and line openings 114 and 110. In one embodiment, less than 5 cycles are needed to deposit the fill material 122 without a seam 124.

Figure 1E:
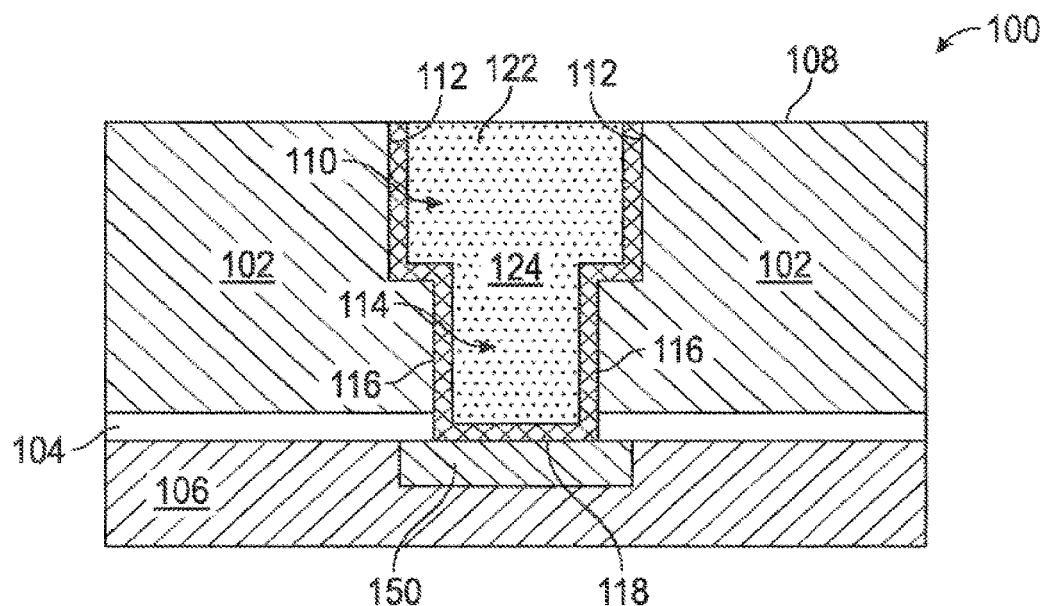

Referring to FIG. 1E, a chemical mechanical planarization (CMP) process may be performed to remove the fill material 122 and the adhesion layer 120 disposed above the top surface 108 of the dielectric layer 102. In one embodiment, the CMP process may be a timed CMP process that is timed to stop at the top surface 108 of the line dielectric layer. In another embodiment, the CMP process may utilize the top surface 108 of the line dielectric layer as a stopping layer. Because the thickness of the fill material deposited above the top surface of the line dielectric layer may vary, utilizing the top surface 108 as a stopping layer may be a more reliable method. In an alternative embodiment, an etch process is used to remove the fill material 122 and the layer 120 disposed above the top surface 108 of the dielectric layer 102.

Figure 2:
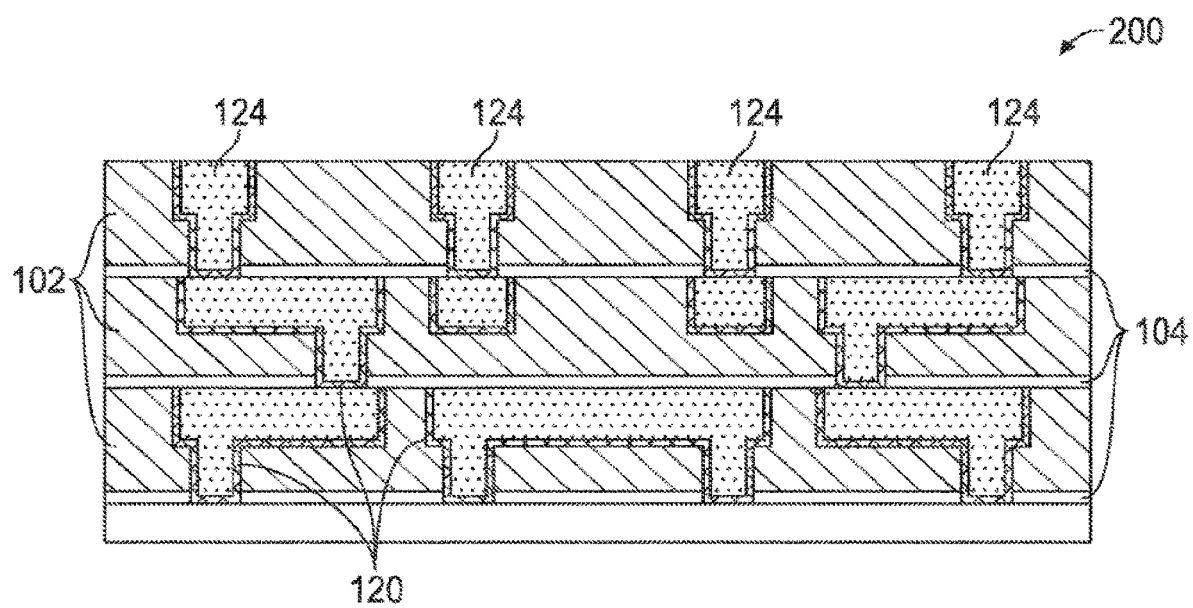
FIG. 2 is a cross-sectional side-view illustration of an integrated circuit with multiple metallization layers formed with cobalt interconnects according to an embodiment of the invention.

FIG. 2 illustrates a cross-section 200 of a portion of an IC structure with cobalt metal interconnects according to an embodiment of the present invention. A stack of dielectric layers 102 includes metal interconnects having adhesion layers 120 and metal (e.g., cobalt) fill layers 124. The portion of the IC structure shown in FIG. 2 can be a portion of a back end of line (BEOL) metallization structure as found, for example, in a microprocessor die or memory die.

Figure 3:
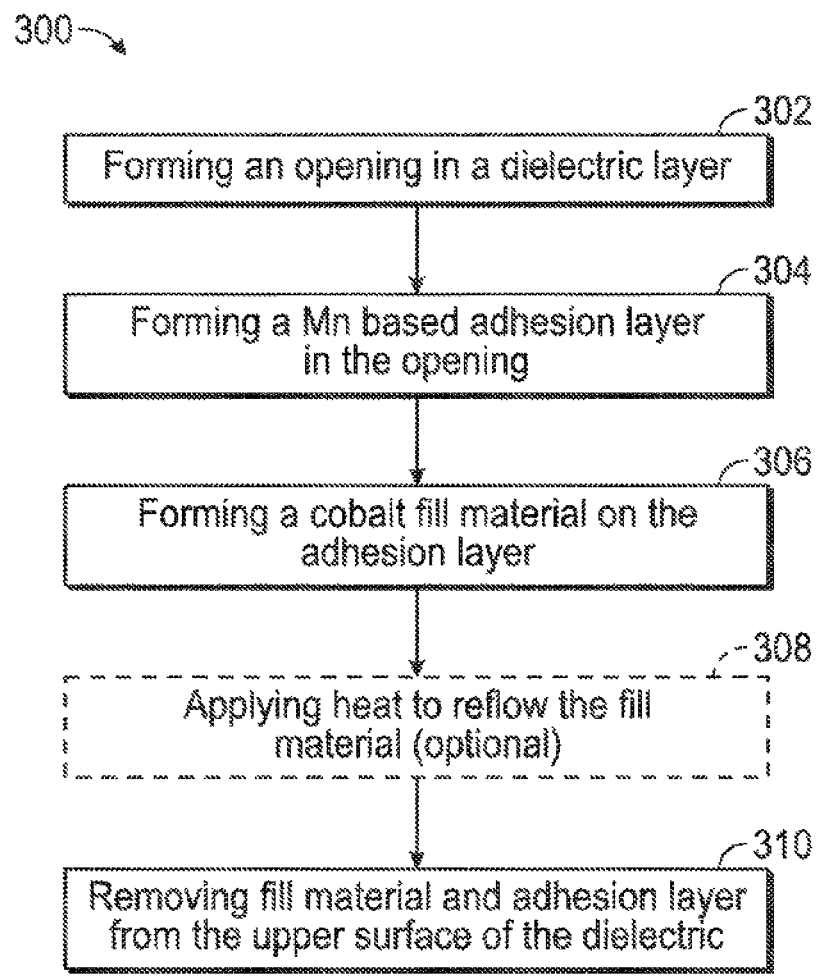
FIG. 3 is a flow chart illustrating a method of forming cobalt interconnects according to an embodiment of the present invention.

FIG. 3 is a flow chart 300 illustrating a method of forming a cobalt metal interconnect according to an embodiment of the present invention. At 302, an opening is formed in a dielectric layer to expose a conductive region in a substrate (or on an additional metal interconnect). At 304, a Mn based adhesion/barrier layer is formed over the substrate, in contact with the conductive region, as well as over the dielectric layer and on sidewalls of the opening. At 306, a fill material is formed on the adhesion layer and fills the opening. The fill material is composed of a cobalt-based material. At 308, in an optional embodiment, heat is applied to reflow the fill material. At 310, the fill material and adhesion layer material disposed above an upper surface of the dielectric layer are removed.

In an embodiment a cobalt-based plug is formed in a lower portion (e.g., a via hole or slot) of an opening in a dielectric layer. A cobalt-based conductive line is then formed on the cobalt-based plug, in an upper portion (e.g., a metal line trench) of the opening, to form a cobalt interconnect.

For example, FIGS. 4A-4D illustrate a method of forming a cobalt metal interconnect according to an embodiment of the invention. The method begins with the same structure as illustrated and described in association with FIG. 1B, which includes adhesion layer 120 and will not be described again for the sake of brevity.

Figure 4A:
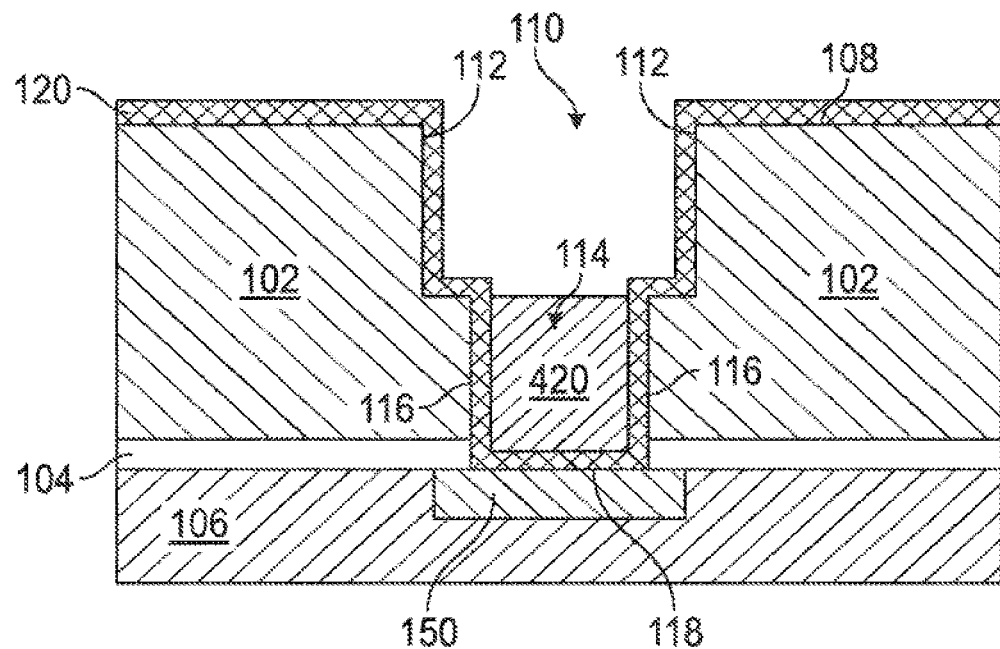
FIGS. 4A-4D are cross-sectional side view illustrations of a method of forming cobalt interconnects with a cobalt plug according to an embodiment of the invention.

Referring to FIG. 4A, a plug 420 is formed on adhesion layer 120. In an embodiment, as depicted, the plug 420 is formed only within the lower opening 114 of the dielectric layer 102 such that the lower opening 114 is completely filled with plug material 420. In another embodiment, however, the top surface of the plug 420 may not be planar with the top surface of the lower opening 114. For example, the top surface of the plug 420 may be higher or lower than the top surface of the lower opening. The top surface of the plug 420 may be at, above, or below the horizontal top surface of layer 120 where layer 120 is horizontally disposed at the top of 114 and bottom of 110. As depicted in FIG. 4A the plug 420 has a top surface just below the horizontal top surface of layer 120 where layer 120 is horizontally disposed at the top of 114 and bottom of 110. In another embodiment, the top surface of the plug 420 may form a mushroom-like dome as a result of the growth profile during formation of plug 420.

In an embodiment, plug 420 is formed in a bottom-up approach. That is, the plug 420 is not formed by conformal deposition. For example, in one embodiment, the formation of plug 420 is performed by selectively depositing on, and then growing from, the surface of layer 120 directly above the conductive region 150. In a specific embodiment, the plug 420 is formed by electrolessly plating the plug material onto an exposed and compatible surface of layer 120. As an example, the conductive region 150 has an upper metalized or metal-containing surface such as cobalt (Co), copper (Cu) or Tungsten (W), and a cobalt-based plug 420 is formed by electroless deposition involving bottom-up growth from the layer 120 above the metalized or metal-containing surface of conductive region 150. In other embodiments, other suitable bottom-up fill and growth deposition approaches may be used such as, but not limited to, electroplating. A bottom-up fill approach is one in which a deposition rate is faster on planar or flat surfaces than on vertical sidewall surfaces.

The plug 420 may be a cobalt-based plug composed of at least 50% cobalt. In a particular embodiment, the plug 420 is composed of at least 90% cobalt. In any such cases, the non-cobalt remainder of the plug 420 composition, if any, can include one or more of Al, Ni, Cu, Ag, Au, Mn, Ti, V, Cr, Fe, Ta, W, Ru, P, B, C, N, Si, Ge, Mg, Zn, Rh, Pt, Cd, Hf, In, Sn, C, O, Be, Ca, Zr, Nb, Mo, Ir, Re, or Pd. In another embodiment, the plug 420 is composed of a cobalt-based compound or alloy material. For example, in one embodiment, the plug 420 is composed of a dilute alloy composed of approximately 0.25-5% of a non-cobalt element, such as those listed above, with the remainder approximately 95+% cobalt, is used. Such a dilute alloy can involve, either during deposition or processing subsequent to deposition, migration of the non-cobalt species to surfaces or interfaces of the cobalt plug. The migration can provide a diffusion barrier for the cobalt and/or be used to enhance adhesion of the cobalt to layer 120. Grain boundaries within the cobalt may also be filled by the non-cobalt species. In other embodiments, however, the plug 420 may include less than 50% cobalt, but still be referred to as a cobalt-based material. Exemplary embodiments of cobalt-based compound plug 420 materials include cobalt silicide or cobalt germanide plug materials. In a specific such embodiment, conductive region 150 includes at least some germanium (e.g., an exposed doped silicon germanium or doped germanium region, or a metal germanide region), and the plug 420 material is a cobalt germanide layer. In another specific such embodiment, conductive region 150 includes at least some silicon (e.g., an exposed doped silicon region, or a metal silicide region), and the plug 420 material is a cobalt silicide layer. Exemplary embodiments of cobalt-based alloy plug 420 materials include cobalt alloyed with one or more of the following: Al, Ni, Cu, Ag, Au, Mn, Ti, V, Cr, Fe, Ta, W, Ru, P, B, C, N, Si, Ge, Mg, Zn, Rh, Pt, Cd, Hf, In, Sn, C, O, Be, Ca, Zr, Nb, Mo, Ir, Re, or Pd. In the above described embodiments, the cobalt plug 420 may have a small grain structure. In an embodiment the above mentioned dopant (i.e., the 0.25-5% of a non-cobalt element) could be used without layer 120 so that cobalt would adhere directly to sidewall 116 as well as portion 150. In an embodiment the dopant essentially creates a layer 120 (an adhesion layer) by diffusion to interfaces such as interfaces at 150 and 116. In one embodiment the dopant forms a layer with portion 150. In another embodiment the dopant makes no layer formation with 150 so that the barrier is bottomless and plug 420 directly contacts area 150.

Figure 4B:
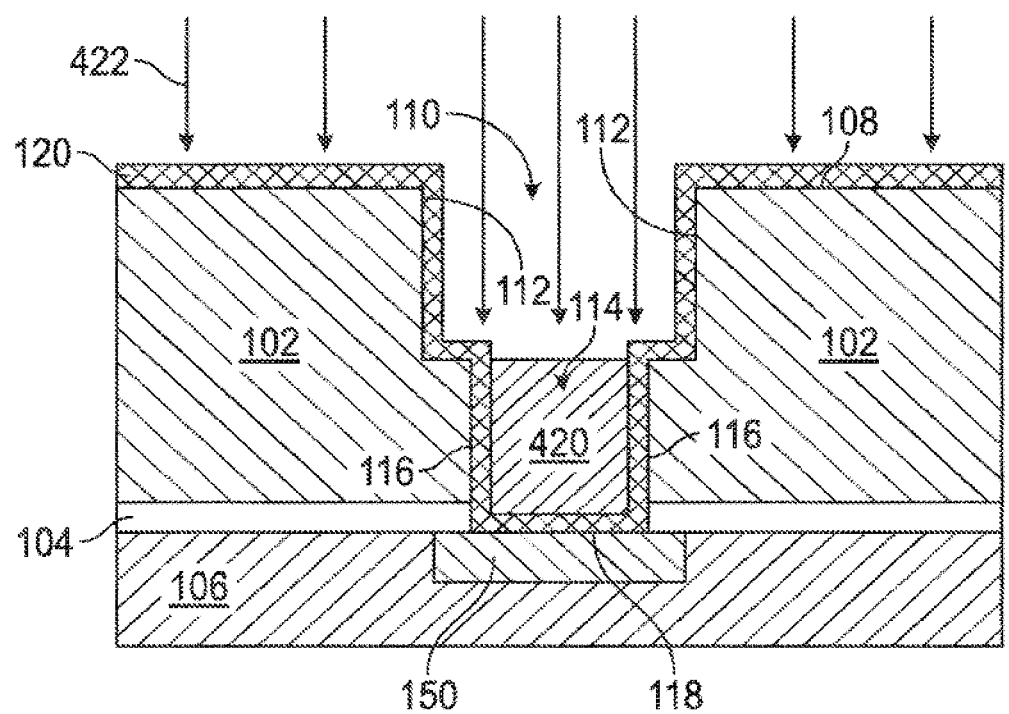

Referring to FIG. 4B, pretreatment 422 may optionally be performed on the exposed top surface of the plug 420 and layer 120. Pretreatment may be performed by a plasma process or ion bombardment to enhance adhesion of a later formed compound to the treated surface. In one embodiment, pretreatment may be performed in a plasma chamber at a temperature ranging from room temperature up to approximately 300° C., 400° C., 500° C. or more for approximately 20 to 60 seconds utilizing, for example, $H_2$/He plasma, Ar plasma, $NH_3$ plasma, $N_2$ plasma, and/or combinations thereof. In another embodiment, the pretreatment may include Ar ion bombardment. It is to be understood that such pretreatment may be performed at other stages of the process flow (e.g., prior to forming plug materials). In an embodiment the pretreatment is performed before layer 120 is formed. However, in other embodiments a treatment of layer 120 can be quite beneficial to density without affecting dielectrics such as layer 102.

Figure 4C:
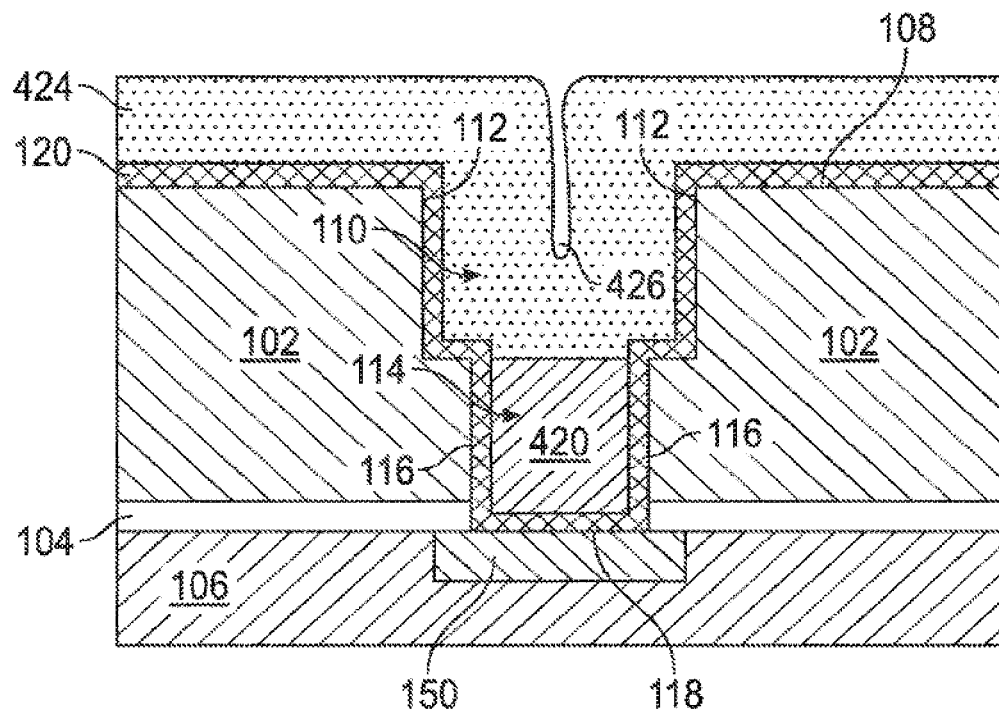

Referring to FIG. 4C, a fill material 424 is formed on the plug 420 and layer 120 within upper opening 110. A seam 426 may be formed within the upper opening 110 subsequent to deposition of the fill material 424. In one embodiment, fill material 424 is composed of a material comprising cobalt. For example, fill material may be composed of, and deposited by, materials and processes described above for fill material 122. Furthermore, the fill material 424 may differ from the plug 420 material by composition and/or deposition technique.

An anneal process may optionally be performed to reflow the deposited fill material 424. The seam 426 from FIG. 4C may be removed subsequent to the anneal process, forming a solid structure within openings 110 and 114 within dielectric layer 102. The anneal process may enable growth of larger grain structures within the fill material 424, decreasing resistivity and expelling impurities from otherwise poor grain structures. In one embodiment, the anneal process involves use of a forming gas such as, but not limited to, nitrogen, hydrogen, or argon. Furthermore, the anneal process may be performed at a temperature less than the thermal budget of the backend structures. For example, in one embodiment, the anneal process is performed at a temperature of room temperature to 300° C., 400° C., 500° C. or more. In another embodiment, the anneal process is performed at a temperature that is higher than the melting point of fill material 424 but lower than the thermal budget of the backend structures. In embodiments the anneal temperature is not higher than the melting point of the material being annealed as reflow of materials to be annealed can happen at much lower temperatures than the melting point for the material to be annealed. In such embodiments anneal temperatures for the material to be annealed may be less than the thermal budget of backend structures.

In yet another embodiment, a cycling technique is optionally utilized to deposit the fill material 424 within the opening 110 without the seam 426. One cycle may involve a single deposition of the fill material 424 and a single anneal process. The anneal operation of one cycle may be set at a temperature and time duration to briefly reflow the fill material 424 to improve step coverage. The deposition operation of one cycle may be a short deposition to deposit less fill material 424, such that several operations are required to completely fill the upper opening 110. In one embodiment, less than 5 cycles are needed to deposit the fill material 424 without a seam 426.

Figure 4D:
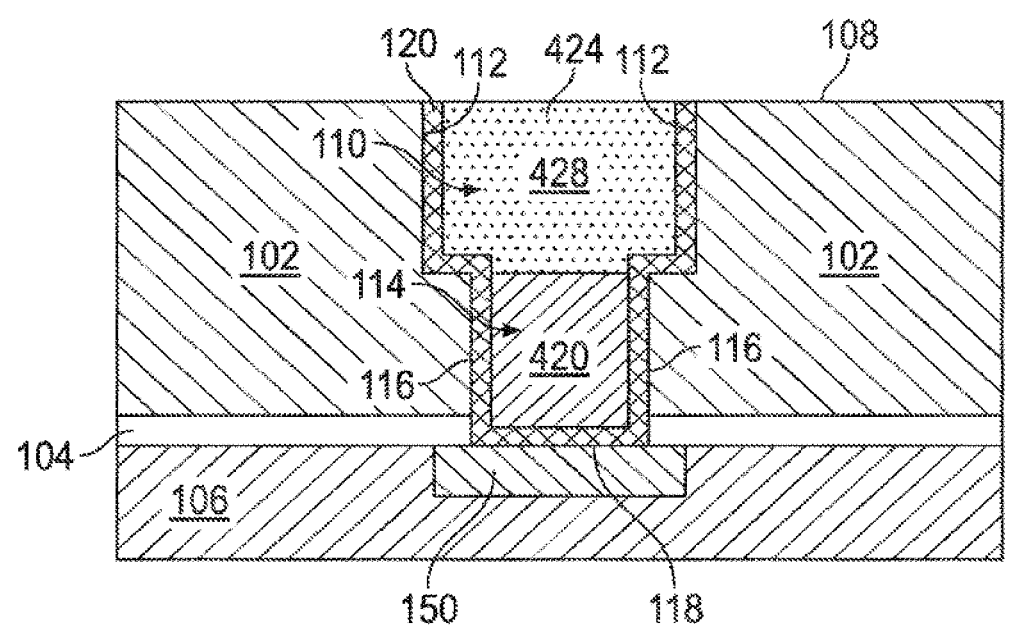

Referring to FIG. 4D, a CMP process may be performed to remove the fill material 424 above the top surface of layer 120 to provide the cobalt-based structure 428. In one embodiment, the CMP process may be a timed CMP process that is timed to stop at the top surface 108 of the line dielectric layer. In another embodiment, the CMP process may utilize the top surface 108 of the dielectric layer 102 as a stopping layer. Because the thickness of the fill material deposited above the top surface 108 of the dielectric layer 102 may vary, utilizing the top surface 108 as a stopping layer may be a more reliable method. In an alternative embodiment, an etch process is used to remove the fill material 424 above the top surface 108 of the dielectric layer 102.

In an embodiment a cobalt-based plug is formed in a lower portion (e.g., a via hole or slot) of an opening in a dielectric layer. An adhesive layer is then formed in an upper portion (e.g., a metal line trench) of the opening, over the cobalt-based plug. A cobalt-based conductive line is then formed on the portion of the adhesive layer that is directly over the plug to fill the upper portion of the opening to form a cobalt interconnect.

For example, FIGS. 5A-5D illustrate a method of forming a cobalt interconnect with a Mn based adhesion layer and a cobalt containing fill layer according to an embodiment of the invention. The method begins with the same structure as illustrated and described in association with FIG. 1A. Next, referring to FIG. 5A, the cobalt-based plug 420 is formed in the lower opening 114 of the dielectric layer 102, on the conductive region 150 of substrate 106. However, in another embodiment the adhesion layer be first formed along the side walls of dielectric 102 and/or on top of portion 150 before plug 420 is formed.

Figure 5A:
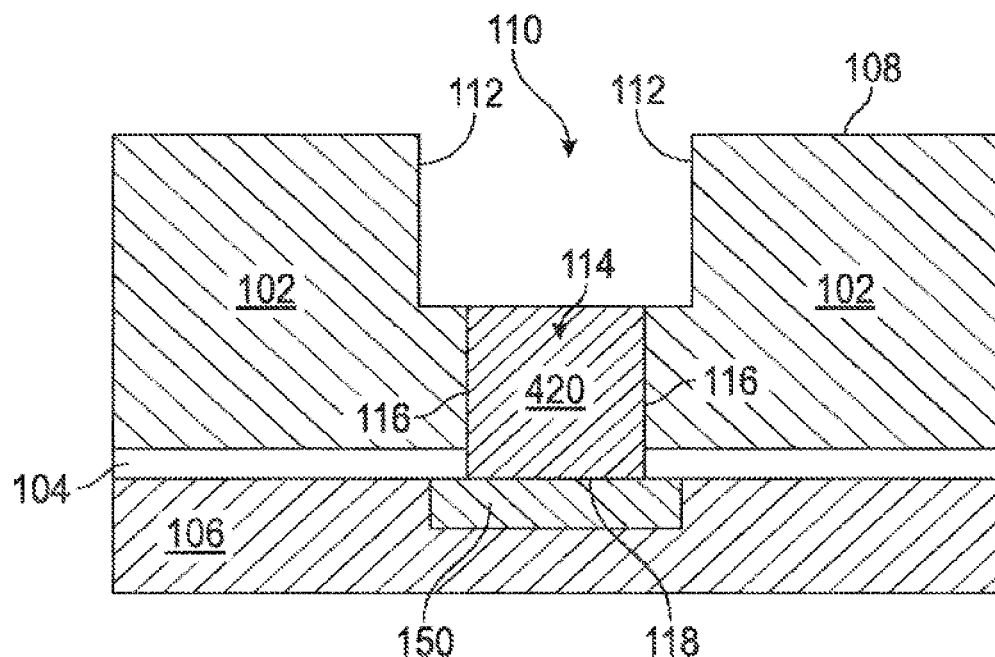
FIGS. 5A-5D are cross-sectional side view illustrations of a method of forming cobalt interconnects with a cobalt plug according to an embodiment of the invention.
Figure 5B:
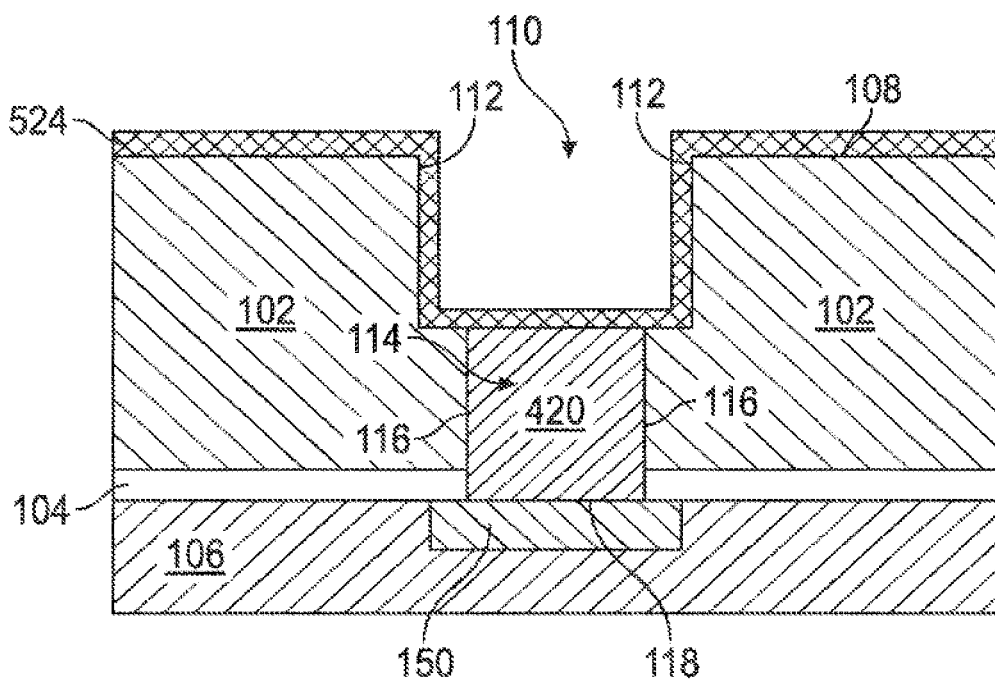

Referring to FIG. 5B, a Mn based adhesion layer 524 (e.g., Mn, MnN, $MnSi_xN_y$, $MnSi_xO_y$ (e.g., $Mn_2[SiO_4]$, $MnSiO_3$), other Mn based silicates, and the like) is deposited conformally with the structure of FIG. 5A. For example, in one embodiment, the Mn based adhesion layer 524 is formed in the upper opening 114 of the dielectric layer 102 and on the exposed plug 420. The composition and method of forming the adhesion layer 524 may be as described for adhesion layer 120 of FIG. 1B.

Figure 5C:
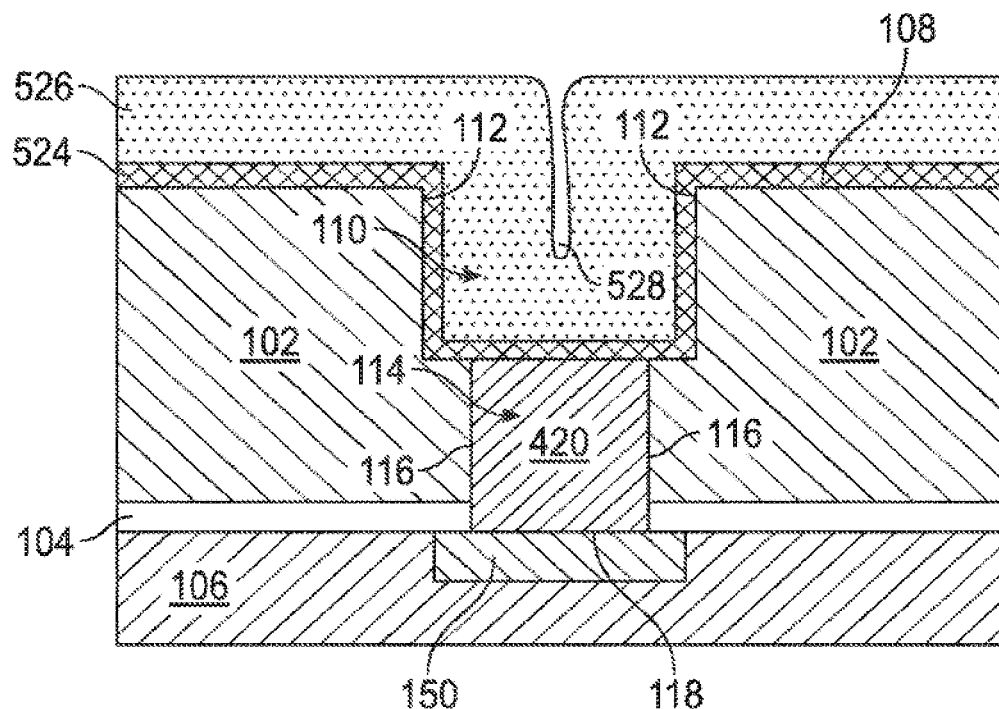

Referring to FIG. 5C, a fill material 526 is formed on the adhesion layer 524, within upper opening 110, and on the top surface 108 of the dielectric layer 102. A seam 528 may be formed within the opening 110 subsequent to deposition of the fill material 526. The composition and method of forming the fill material layer 526 may be as described for fill material 122 of FIG. 1C. Furthermore, although in an embodiment the plug 420 and the fill material 526 are all cobalt-based, they may all differ from one another by composition and/or deposition technique.

An anneal process may optionally be performed to reflow the deposited fill material 526. The seam 528 from FIG. 5C may be removed subsequent to the anneal process, forming a solid structure within opening 110 of dielectric layer 102. The anneal process may enable growth of larger grain structures within the fill material 526, decreasing resistivity and expelling impurities from poor grain structures. In one embodiment, the anneal process involves a use of gas such as, but not limited to, nitrogen, hydrogen, or argon. Furthermore, the anneal process may be performed at a temperature less than the thermal budget of the backend structures. For example, in one embodiment, the anneal process is performed at a temperature of room temperature to 300° C., 400° C., 500° C. or more. In another embodiment, the anneal process is performed at a temperature that is higher than the melting point of fill material 526 but lower than the thermal budget of the backend structures. In embodiments the anneal temperature is not higher than the melting point of the material being annealed as reflow of materials to be annealed can happen at much lower temperatures than the melting point for the material to be annealed. In such embodiments anneal temperatures for the material to be annealed may be less than the thermal budget of backend structures.

In yet another embodiment, a cycling technique may be utilized to deposit the fill material 526 within the opening 110 without the seam 528. One cycle may involve one deposition of the fill material 526 and one anneal process. The anneal operation of one cycle may be set at a temperature and time duration to briefly reflow the fill material to improve step coverage. The deposition operation of one cycle may be a short deposition to deposit less fill material, such that several operations are required to completely fill the opening 510. In one embodiment, less than 5 cycles are needed to deposit the fill material 526 without a seam 528.

Figure 5D:
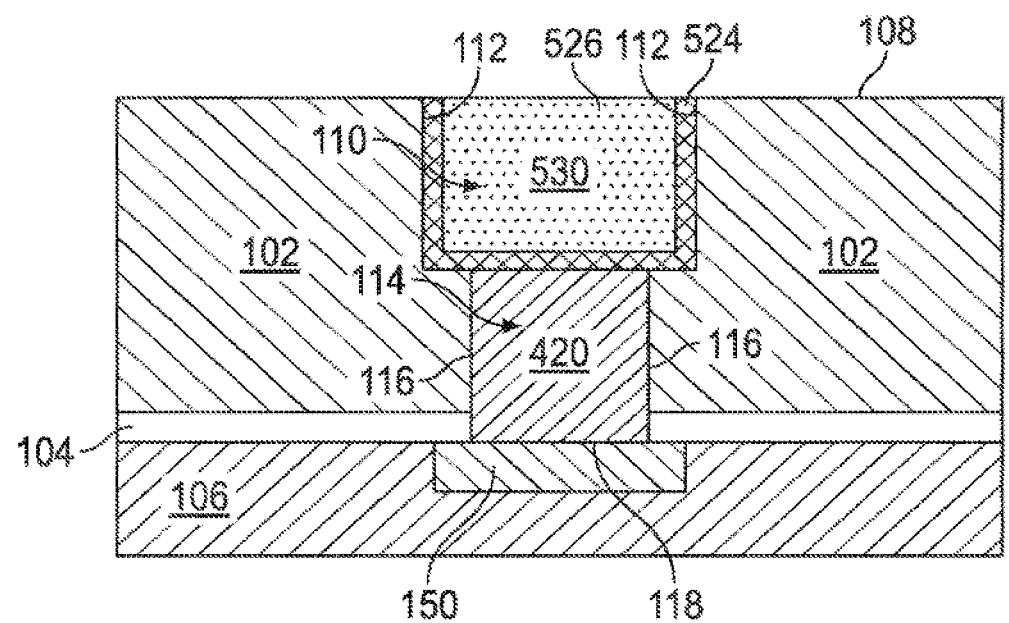

Referring to FIG. 5D, a CMP process may be performed to remove the fill material 526 and the adhesion layer 524 disposed above the top surface 108 of the dielectric layer 102 to provide the cobalt-based structure 530. In one embodiment, the CMP process may be a timed CMP process that is timed to stop at the top surface 108 of the dielectric layer 102. In another embodiment, the CMP process may utilize the top surface 108 of the dielectric layer 102 as a stopping layer. Because the thickness of the fill material deposited above the top surface 108 of the dielectric layer 102 may vary, utilizing the top surface 108 as a stopping layer may be a more reliable method. In an alternative embodiment, an etch process is used to remove the fill material 526 and the layer 524 disposed above the top surface 108 of the dielectric layer 102.

Figure 6:
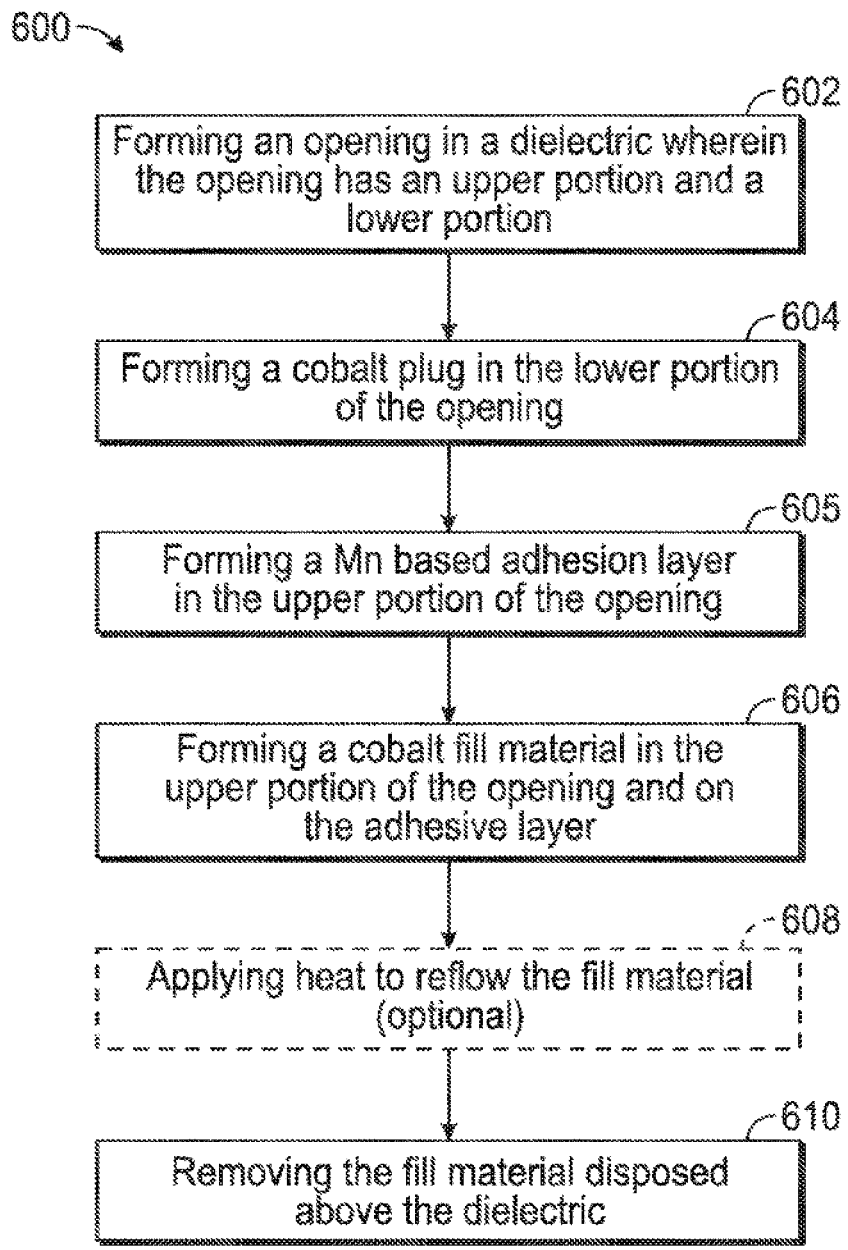
FIG. 6 is a flow chart illustrating a method of forming cobalt interconnects with a cobalt plug according to an embodiment of the invention.

FIG. 6 is a flow chart 600 illustrating a method of forming a cobalt metal interconnect according to an embodiment of the present invention. At 602, an opening is formed in a dielectric layer to expose a conductive region in a substrate. At 604, a cobalt plug is formed in a lower portion of the opening, in contact with the conductive region. At 605 a Mn based adhesion layer (e.g., Mn, MnN, MnSi$_x$N$_y$ and the like) is formed in the upper portion of the opening. At 606, a fill material is formed on the plug and adhesion layer to fill the opening. The fill material is composed of a cobalt-based material. At 608, in an optional embodiment, heat is applied to reflow the fill material. At 610, the fill material disposed above an upper surface of the dielectric layer is removed. In one such embodiment, the fill material and the plug both include cobalt, but have different material compositions. In another such embodiment, the fill material and the plug both include cobalt, but are formed by different deposition or growth techniques. In yet another such embodiment, the fill material and the plug both include cobalt, but have different material compositions and are formed by different deposition or growth techniques.

In an embodiment a metal gate electrode of a semiconductor device is composed, as least partially, of cobalt. That is, embodiments of the present invention need not be limited to forming cobalt-based interconnects.

Figure 7:
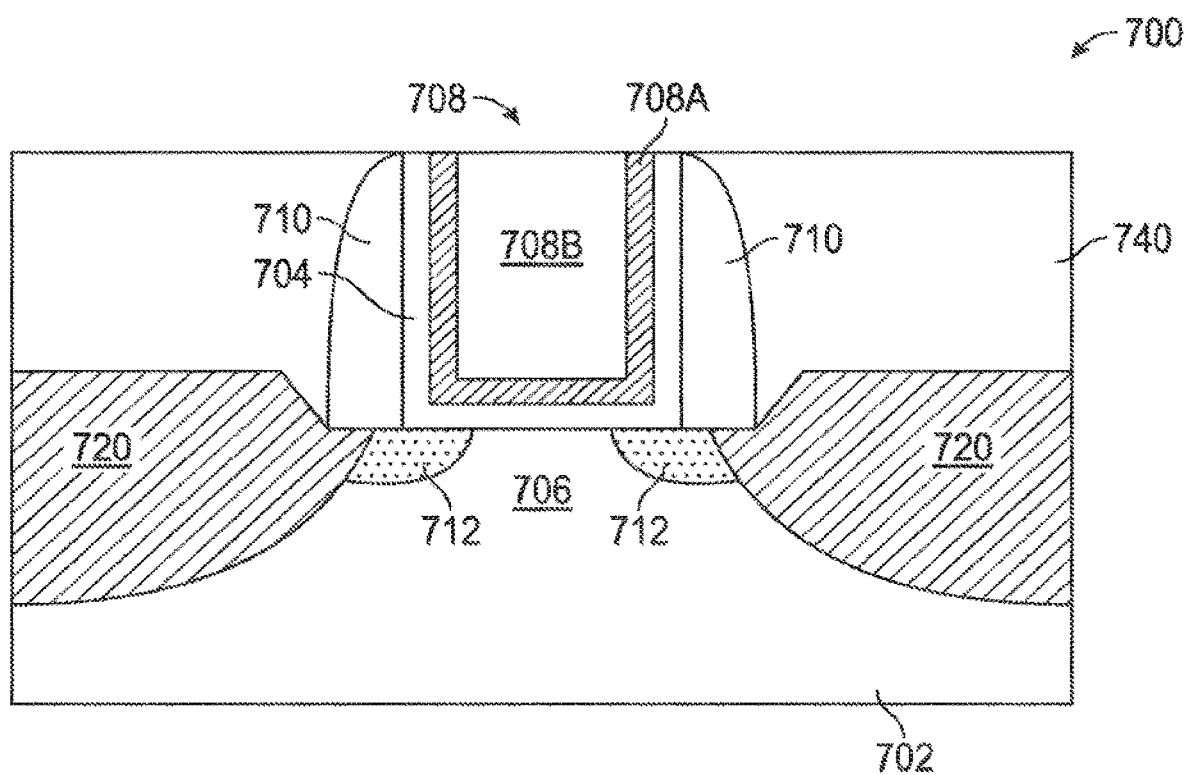
FIG. 7 depicts a semiconductor field effect transistor (FET) including a cobalt-based metal gate electrode, in accordance with an embodiment of the present invention.

In an example, FIG. 7 depicts a metal oxide semiconductor field effect transistor (MOS-FET) 700 fabricated on a substrate 702, in accordance with an embodiment of the present invention. A gate dielectric layer 704 is disposed above a channel region 706, and a gate electrode 708 is disposed above gate dielectric layer 704. Gate dielectric layer 704 and gate electrode 708 may be isolated by gate isolation spacers 710. Tip extensions 712 may be formed by implanting dopant atoms into substrate 702. Source and drain regions (e.g., strain-inducing source/drain regions 720) may be formed by selectively growing an epitaxial film in etched-out portions of substrate 702 and are doped either in situ or after epitaxial film growth, or both. In an embodiment tip extensions 712 may be formed simultaneously with the source and drain regions to create "epi" tip extensions. In typical MOS-FETs, the channel region 706 is composed of a semiconductor material, such as single crystalline silicon. In an embodiment, the gate electrode 708 is a metal gate electrode (e.g., the workfunction of the gate electrode 708 is based on a metal or metal-containing layer). In one such embodiment, the metal gate electrode is composed, at least somewhat, of cobalt. For example, in a specific embodiment, the metal gate electrode 708 includes a Mn based adhesion layer (e.g., Mn, MnN, MnSi$_x$N$_y$ and the like as described above) 708A and a cobalt fill metal thereon 708B. For example, the cobalt-based material or film 708B is composed of at least 90% cobalt. In a specific such embodiment, the cobalt-based material or film 708B is composed of a dilute alloy having approximately 0.25-5% of a non-cobalt element, with the remainder approximately 95+% cobalt.

Also, it is to be understood that the MOS-FET 700 may be a planar device or include a three-dimensional body (e.g., as in a double-gate, fin-fet, tri-gate, or gate-all-around transistor). As such, the substrate 702 may be a planar substrate or depict a cross-sectional view of a three-dimensional body. Finally, it is to be understood that only several features of the MOS-FET 700 are depicted for clarity. It is to be understood that isolation layers, e.g., interlayer dielectric layer 740, and metallization routing layers used for integrating MOS-FET 700 into, e.g., an integrated circuit may also be included, as is well known in the art.

Various cobalt based embodiments may be included in, for example, a mobile computing node such as a cellular phone, Smartphone, tablet, Ultrabook®, notebook, laptop, personal digital assistant, and mobile processor based platform.

Example 1 includes a dielectric layer disposed on a substrate; an opening in the dielectric layer, wherein the opening has sidewalls and exposes a conductive region of at least one of the substrate and an additional interconnect structure; an adhesive layer, comprising manganese, disposed over the conductive region and on the sidewalls; and a fill material, comprising cobalt, within the opening and on a surface of the adhesion layer. In an embodiment the dielectric directly contacts the substrate but in other embodiments one or more layers are between the dielectric and the substrate. In an embodiment the additional interconnect structure may include a via, a trench filled with metal (interconnect line), and the like. While examples have included dual damascene approaches the opening addressed immediately above need not have varying widths such as those found in, for example, FIG. 1 or the line over via commonly associated with dual damascene processes. As explained below, saying "an adhesive layer, comprising manganese, disposed over the conductive region" does not necessarily mean manganese will be in the portion of the adhesive layer that is over the conductive region. For example, "an adhesive layer, comprising manganese, disposed over the conductive region" is still satisfied if manganese in not in the adhesion layer portion over the conductive region but is in the adhesion layer that is on the sidewalls.

In example 2 the subject matter of Example 1 can optionally include wherein the fill material is composed of at least 50 atomic % cobalt.

In example 3 the subject matter of Examples 1-2 can optionally include wherein the adhesion layer includes at least one element selected from a group consisting of silicon, nitrogen, carbon, hydrogen, and oxygen.

In example 4 the subject matter of Examples 1-3 can optionally include wherein the adhesion layer is no thicker than 50 A.

In example 5 the subject matter of Examples 1-4 can optionally include wherein the adhesion layer directly contacts the fill material.

In example 6 the subject matter of Examples 1-5 can optionally include wherein the adhesion layer directly contacts the conductive region. In another version of example 6 the subject matter of Examples 1-5 can optionally include wherein the adhesion layer directly contacts the conductive region and the dielectric layer.

In example 7 the subject matter of Examples 1-6 can optionally include wherein the fill material includes at least one element selected from a group consisting of silicon and manganese. This may be due to silicon or manganese migrating from the adhesion layer into the fill material and/or this may be due to the fill material being deposited with silicon and/or manganese already present in addition to cobalt.

In example 8 the subject matter of Examples 1-7 can optionally include wherein the fill material includes manganese that directly contacts the manganese included in the adhesion layer. The cobalt fill layer may include manganese and/or silicon. This may not be visually evident with a scanning electron microscopic (SEM) image or transmission electron microscopic (TEM) image but other detection methods may indicate the presence of manganese and/or silicon in the cobalt fill layer. The manganese and/or silicon may be present along the outer edge of the cobalt fill layer because the manganese and/or silicon may have migrated from the adhesion layer to the cobalt fill layer. For example, there is solubility between manganese and cobalt and the manganese from the adhesion layer, in contact with the fill layer, may have mixed with the cobalt fill layer. This migration helps the cobalt fill adhere to the adhesion layer and also allows the adhesion layer to function as a wetting layer for the cobalt fill layer. A wetting layer includes an initial layer of atoms epitaxially grown on a surface upon which self-assembled quantum dots or thin films are created.

An example concerns TEM energy dispersive x-rays (EDX). The small TEM probe electrons interact with material being imaged and that material emits x-rays from the different elements present within one pixel of the image. This allows for elemental maps of the image. Higher sensitivity is achieved by taking line scans across structures with more dwell time (e.g., across a via rather than every pixel in image). In an embodiment (example 8a) if there is manganese in the cobalt fill layer, the manganese may migrate to the adhesion layer/fill material interface improving adhesion. EDX may then detect manganese in the cobalt fill layer and around the adhesion layer/fill layer edge/interface. In an embodiment (example 8b) if manganese is at the adhesion layer/fill layer interface it might diffuse into cobalt and other interfaces (e.g., like top layer after CMP has been performed). Such a case would be detected in both the fill layer and around edges/interfaces. In an embodiment, if no diffusion of manganese occurs the manganese may only be in the fill layer of example 8a and at the interface in example 8b. In embodiment, if manganese is present both in 120 and the fill layer, the manganese may be detected in both areas. Diffusion may change relative concentrations/compositions and ability to adhere or wet so the processes of examples 8a and/or 8b take place but manganese may still be detectable in both scenarios in an embodiment.

An embodiment is similar to the embodiment of FIG. 5D but includes a dielectric capping layer/etch stop (e.g., similar or directly equal to the materials and structure of element 104) that extends from the top surface on the left dielectric portion 102, across the tops of 524 and 526, and then across the top of the right dielectric portion 102. This caps the polished metal and is later broken through by etch to form a via for a next layer just like shown with a via going through space 116 and through layer 104 in FIG. 5D. The cap protects the lines (e.g., material 530) hermetically and manganese (which in this embodiment is mixed and present in cobalt fill 530) would diffuse to the capping layer to improve adhesion of dielectric capping layer/etch stop to the cobalt 530 (e.g., by silicate formation). The manganese may diffuse from layer 120 or diffuse from an alloy cobalt fill layer that was deposited already including some amount of manganese. The dielectric cap may be deposited at a high temperature and so that temperature drives the thermal diffusion of manganese from within the layers 120 and/or 530 and/or 420 up to the top of the trench 110. The manganese could be detected at the new dielectric cap/layer 530 interface by TEM EDX methods and the like.

In another example the subject matter of Examples 1-8 can optionally include a dielectric layer formed directly on top of the adhesive layer and the fill material, the dielectric layer comprising manganese; wherein the fill material also includes manganese. The manganese may have migrated from the adhesion layer and/or adhesion layer into the dielectric.

In another example 9 the subject matter of Examples 1-8 can optionally include a dielectric layer formed directly on top of the fill material, the dielectric layer comprising a first material; wherein the first material is also included in the fill material and the first material is selected from the group comprising Al, Ni, Cu, Ag, Au, Mn, Ti, V, Cr, Fe, Ta, W, Ru, P, B, C, N, Si, Ge, Mg, Zn, Rh, Pt, Cd, Hf, In, Sn, C, O, Be, Ca, Zr, Nb, Mo, Ir, Re, and Pd. The material may have migrated into the dielectric from the fill material.

In example 9 the subject matter of Examples 1-8 can optionally include wherein (a) the adhesion layer includes a first portion directly contacting the dielectric layer and second portion directly contacting the conductive region, and (b) the first portion includes a higher atomic % manganese than the second portion. Manganese bonds well with the dielectric as well as the cobalt fill layer. On the adhesion layer/dielectric interface manganese forms $MnSi_xO_y$ (e.g., $Mn_2[SiO_4]$, $MnSiO_3$), and other Mn based silicates. The silicate has the function of a diffusion barrier, preventing diffusion of cobalt into the surrounding dielectric and will also will have adhesive/wetting functions making sure cobalt adheres well to the dielectric. On the adhesion layer/cobalt fill layer interface metal-to-metal bonding occurs (e.g., between the manganese and cobalt) and results in some alloying at the interface. This bonding gives an additional benefit that manganese will dissolve at the via bottom (where in an embodiment the adhesion layer directly contacts the metal fill layer and possibly another interconnect or a conduction substrate portion). This lowers electrical resistance in the via at the adhesion layer interface to the other interconnect or conductive portion of the substrate. For example, the manganese from 120 that forms at the via bottom initially starts out as thick as similar 120 portions on ILD. After anneal the manganese may diffuse completely into the cobalt fill or may remain in layer 120. The amount that remains may vary. Thus, in some embodiments the adhesion layer near the bottom of the via may have little to no manganese remaining after device processing is complete.

In example 10 the subject matter of Examples 1-9 can optionally include wherein the fill material consists essentially of cobalt. In another example the subject matter of Examples 1-9 can optionally include wherein the adhesion layer does not completely separate the conductive region from the fill material and the fill material directly contacts a portion of the conductive region. Thus, by TEM EDX detection or otherwise (regardless of whether the adhesion layer completely or incompletely separates the fill material from the conductive region); there may be areas where no manganese in an adhesion layer separates the fill material from the conductive region. This may be deemed an area where there is no adhesion layer present that can be detected (regardless of whether the layer is there or not) and thus the "adhesion layer does not completely separate the conductive region from the fill material and the fill material directly contacts a portion of the conductive region."

Example 11 includes a method of forming a metal interconnect structure, comprising: forming an opening in a dielectric layer on a substrate, wherein the opening exposes a conductive region of at least one of the substrate and an additional interconnect structure; forming an adhesion layer, comprising manganese, in the opening and on the conductive region and also on the sidewalls; forming a fill material, comprising cobalt, within the opening and on a surface of the adhesion layer; and removing portions of the fill material and the adhesion layer above an upper surface of the dielectric layer.

In example 12 the subject matter of Example 11 can optionally include wherein the adhesion layer includes at least one element selected from a group consisting of silicon, nitrogen, carbon, hydrogen, and oxygen.

In example, 13 the subject matter of examples 11-12 can optionally include wherein the adhesion layer directly contacts the fill material.

In example 14 the subject matter of Examples 11-13 can optionally include wherein the adhesion layer directly contacts the conductive region.

In example 15 the subject matter of Examples 13-14 can optionally include wherein (a) the adhesion layer includes a first portion directly contacting the dielectric layer and second portion directly contacting the conductive region, and (b) the first portion includes a higher atomic % manganese than the second portion.

In example 16 the subject matter of Examples 13-15 can optionally include forming the adhesion layer with a conformal method and forming the fill layer with a method that is non-conformal.

In another example the subject matter of Examples 13-15 can optionally include forming a dielectric layer directly on top of the adhesive layer and the fill material, the dielectric layer comprising manganese; wherein the fill material also includes manganese. Again, the manganese may have migrated into the dielectric from the adhesive layer and/or fill material.

Example 17 includes a metal interconnect structure, comprising: a dielectric layer disposed on a substrate; an opening disposed in the dielectric layer and exposing a conductive region in at least one of the substrate and an additional interconnect structure, the opening having a lower portion and an upper portion; a plug comprising cobalt disposed in the lower portion of the opening; an adhesive layer, comprising manganese, disposed on the sidewalls; and a fill material comprising cobalt disposed on the plug and in the upper portion of the opening.

In example 18 the subject matter of Example 17 can optionally include wherein the adhesive layer directly contacts the plug and the dielectric.

In example 19 the subject matter of Examples 17-18 can optionally include wherein the adhesive layer is between the plug and the fill material.

In example 20 the subject matter of Examples 17-19 can optionally include wherein the plug and fill material have different compositions.

In another example 20 the subject matter of Examples 17-19 can optionally include a dielectric layer formed directly on top of the adhesive layer and the fill material, the dielectric layer comprising manganese; wherein the fill material also includes manganese. The manganese may have migrated from the adhesion layer into the dielectric.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of fabricating an integrated circuit structure, the method comprising:
   forming a dielectric layer;
   forming an opening in the dielectric layer, the opening having an upper portion and a lower portion;
   forming a cobalt plug in the lower portion of the opening;
   forming a manganese-based adhesion layer on sidewalls of the upper portion of the opening and on the cobalt plug;
   forming a cobalt fill material in the upper portion of the opening and on the manganese-based adhesion layer; and
   applying heat to reflow the cobalt fill material.

2. The method of claim 1, wherein the cobalt plug comprises at least 50% cobalt.

3. The method of claim 2, wherein the cobalt plug further comprises one or more of Al, Ni, Cu, Ag, Au, Mn, Ti, V, Cr, Fe, Ta, W, or Ru.

4. The method of claim 1, wherein the cobalt plug comprises at least 90% cobalt.

5. The method of claim 4, wherein the cobalt plug further comprises one or more of Al, Ni, Cu, Ag, Au, Mn, Ti, V, Cr, Fe, Ta, W, or Ru.

6. The method of claim 1, wherein the manganese-based adhesion layer comprises a material selected from the group consisting of Mn, MnN, MnSixNy, and MnSixOy.

7. The method of claim 1, wherein the cobalt fill material consists essentially of cobalt.

8. The method of claim 1, wherein the cobalt fill material comprises 95+% cobalt with the remainder comprising one or more of Al, Ni, Cu, Ag, Au, Mn, Ti, V, Cr, Fe, Ta, W, or Ru.

9. The method of claim 1, wherein the cobalt fill material comprises a material different than the cobalt plug.

10. The method of claim 1, wherein the cobalt fill material consists essentially of cobalt, the cobalt plug comprises at least 50% cobalt, the manganese-based adhesion layer comprises a material selected from the group consisting of Mn, MnN, MnSixNy, and MnSixOy, and wherein the cobalt fill material comprises a material different than the cobalt plug.

11. A method of fabricating an integrated circuit structure, the method comprising:
   forming a dielectric layer;
   forming an opening in the dielectric layer, the opening having an upper portion and a lower portion, the upper portion having a width greater than a width of the lower portion;
   forming a cobalt plug in the lower portion of the opening;
   forming a manganese-based adhesion layer on sidewalls of the upper portion of the opening and on the cobalt plug; and
   forming a cobalt fill material in the upper portion of the opening and on the manganese-based adhesion layer.

12. The method of claim 11, wherein the cobalt plug comprises at least 50% cobalt.

13. The method of claim 12, wherein the cobalt plug further comprises one or more of Al, Ni, Cu, Ag, Au, Mn, Ti, V, Cr, Fe, Ta, W, or Ru.

14. The method of claim 11, wherein the cobalt plug comprises at least 90% cobalt.

15. The method of claim 14, wherein the cobalt plug further comprises one or more of Al, Ni, Cu, Ag, Au, Mn, Ti, V, Cr, Fe, Ta, W, or Ru.

16. The method of claim 11, wherein the manganese-based adhesion layer comprises a material selected from the group consisting of Mn, MnN, MnSixNy, and MnSixOy.

17. The method of claim 11, wherein the cobalt fill material consists essentially of cobalt.

18. The method of claim 11, wherein the cobalt fill material comprises 95+% cobalt with the remainder comprising one or more of Al, Ni, Cu, Ag, Au, Mn, Ti, V, Cr, Fe, Ta, W, or Ru.

19. The method of claim 11, wherein the cobalt fill material comprises a material different than the cobalt plug.

20. The method of claim 11, wherein the cobalt fill material consists essentially of cobalt, the cobalt plug comprises at least 50% cobalt, the manganese-based adhesion layer comprises a material selected from the group consisting of Mn, MnN, MnSixNy, and MnSixOy, and wherein the cobalt fill material comprises a material different than the cobalt plug.

21. The method of claim 1, wherein the cobalt plug is formed in the lower portion of the opening after forming the upper portion of the opening and the lower portion of the opening.

22. The method of claim 11, wherein the cobalt plug is formed in the lower portion of the opening after forming the upper portion of the opening and the lower portion of the opening.

* * * * *